(12) United States Patent
Baba

(10) Patent No.: US 8,495,277 B2
(45) Date of Patent: Jul. 23, 2013

(54) SEMICONDUCTOR INTEGRATED CIRCUIT, SYSTEM DEVICE INCLUDING SEMICONDUCTOR INTEGRATED CIRCUIT, AND SEMICONDUCTOR INTEGRATED CIRCUIT CONTROL METHOD

(75) Inventor: Mitsushige Baba, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 956 days.

(21) Appl. No.: 12/092,568

(22) PCT Filed: Aug. 31, 2007

(86) PCT No.: PCT/JP2007/067463
§ 371 (c)(1),
(2), (4) Date: May 2, 2008

(87) PCT Pub. No.: WO2008/029903
PCT Pub. Date: Mar. 13, 2008

(65) Prior Publication Data
US 2009/0287873 A1 Nov. 19, 2009

(30) Foreign Application Priority Data

Sep. 7, 2006 (JP) ................................ 2006-242471

(51) Int. Cl.
*G06F 13/00* (2006.01)
*G06F 13/28* (2006.01)
*G06F 12/00* (2006.01)

(52) U.S. Cl.
USPC .................. 711/103; 711/154; 711/E12.008; 713/324; 365/226; 710/22; 710/100

(58) Field of Classification Search
USPC ..... 711/103, 154, E12.008; 365/226; 710/22, 710/100; 713/324
See application file for complete search history.

(56) References Cited

U.S. PATENT DOCUMENTS

| 2005/0083418 | A1* | 4/2005 | Sasaki ...................... 348/231.99 |
| 2005/0247858 | A1 | 11/2005 | Misawa |
| 2006/0053420 | A1 | 3/2006 | Soga |
| 2006/0156302 | A1 | 7/2006 | Yamamoto et al. |
| 2006/0192859 | A1* | 8/2006 | Sasaki ........................ 348/222.1 |
| 2006/0262123 | A1 | 11/2006 | Baba |
| 2007/0208921 | A1* | 9/2007 | Hosouchi et al. ............. 711/170 |
| 2009/0138739 | A1* | 5/2009 | Ginggen et al. .............. 713/324 |

FOREIGN PATENT DOCUMENTS

| JP | 5-257574 | 10/1993 |
| JP | 2002-14833 | 1/2002 |
| JP | 2002-24159 | 1/2002 |

(Continued)

*Primary Examiner* — Edward Dudek, Jr.

(74) *Attorney, Agent, or Firm* — Dickstein Shapiro LLP

(57) ABSTRACT

A disclosed semiconductor integrated circuit interfaces an external circuit and a host for controlling the external circuit and obtains data used to interface the external circuit and the host from a rewritable external memory. The disclosed semiconductor integrated circuit includes external terminals to which an external signal line group is connected, the external signal line group including signal lines connecting the external circuit and the external memory in parallel; an external terminal interface circuit configured to interface the semiconductor integrated circuit and the external circuit or the external memory connected via the external signal line group; and a control circuit configured to activate or deactivate the external circuit and the external memory. The control circuit is configured to activate either the external circuit or the external memory that is to be accessed via the external terminal interface circuit.

20 Claims, 13 Drawing Sheets

FOREIGN PATENT DOCUMENTS

| | | |
|---|---|---|
| JP | 2002-55744 | 2/2002 |
| JP | 2005-123858 | 5/2005 |
| JP | 2005-323162 | 11/2005 |
| JP | 2006/109427 | 4/2006 |
| JP | 2006-190132 | 7/2006 |
| JP | 2006-238298 | 9/2006 |
| TW | 449907 | 8/2001 |
| TW | 498330 | 8/2002 |

* cited by examiner

SEMICONDUCTOR INTEGRATED CIRCUIT, SYSTEM DEVICE INCLUDING SEMICONDUCTOR INTEGRATED CIRCUIT, AND SEMICONDUCTOR INTEGRATED CIRCUIT CONTROL METHOD

TECHNICAL FIELD

The present invention generally relates to a semiconductor integrated circuit used for a device such as a camcorder or a camera that includes, for example, a complementary metal-oxide semiconductor (CMOS) image sensor or a charge-coupled device (CCD) image sensor and is connectable to a parallel bus or a high-speed serial bus such as a universal serial bus (USB), a system device including the semiconductor integrated circuit, and a method of controlling the semiconductor integrated circuit.

BACKGROUND ART

In recent years, it has become very easy to hold a videoconference or to make a video-phone call using a camera including a CMOS sensor that is connectable via a USB to a personal computer (hereafter called a PC). This is largely due to development of small CMOS-sensor cameras (so called Web cameras) having high pixel counts and equipped with USB interfaces that are commonly used as general-purpose interfaces of PCs. Reducing the sizes of Web cameras is especially important for use with notebook PCs and liquid crystal displays. This in turn makes it necessary to reduce the sizes of CMOS sensors, USB LSIs, and peripheral circuits that constitute Web cameras.

FIG. 13 shows an exemplary configuration of a conventional Web camera system. As shown in FIG. 13, a Web camera 105 includes an optical lens 101, a CMOS sensor 102, a USB controller 103, and a regulator 104. The Web camera 105 is connected via a USB interface in the USB controller 103 to a PC 106. A charge-coupled device (CCD) sensor may be used in place of the CMOS sensor 102.

FIG. 14 is a block diagram illustrating an exemplary internal configuration of the USB controller 103 shown in FIG. 13. As shown in FIG. 14, the USB controller 103 includes a CMOS sensor interface circuit 107, an image data FIFO 108, a USB interface circuit 109, a CPU 110, and a program ROM 111. The USB controller 103 may also include an erasable programmable read-only memory (EPROM) in addition to the program ROM 111.

The USB controller 103 is implemented as an LSI. The LSI is preferably designed to be connectable to various CMOS sensors and CCD sensors.

Meanwhile, to connect the USB controller 103 to various CMOS and CCD sensors, it is necessary to configure various settings (for example, addresses and data) for each of those sensors. Configuration of settings for a connected CMOS or CCD sensor (in this example, the CMOS sensor 102) is normally performed by the CPU 110 according to a program stored in the program ROM 111 via the CMOS sensor interface circuit 107 interfacing the CMOS sensor 102 and the USB controller 103. One disadvantage of the USB controller 103 is that since the program ROM 111 is a read-only memory, only programs preinstalled at the factory are available. This means that the USB controller 103 is adaptable only to predetermined types of sensors.

One way to solve the above problem is to provide a rewritable memory such as an EPROM or a RAM in a USB controller so that programs can be added or replaced after manufacturing (see, for example, patent document 1). However, adding an EPROM increases the production and testing costs of a USB controller. Also, using a RAM instead of an EPROM causes another problem, since programs in the RAM are lost when power to the USB controller is cut off.

Assuming that a Web camera operates with the USB protocol, after power is turned off and on, the Web camera is recognized again as a USB device by a PC. Since settings for its CMOS sensor (or a CCD sensor) are lost during this process, those settings must be reconfigured. Therefore, when using a RAM, it is necessary to reinstall programs constituting the firmware of the Web camera. One way to reinstall the programs is to download them from a host computer (see, for example, patent document 2). Another way is to transfer the programs from an external memory such as an EPROM (see, for example, patent document 3).

Reinstalling programs by downloading is a very cost-effective way. However, this method requires a dedicated downloading program on the host computer and some users do not like to install such a program in their host computers. On the other hand, with the latter method where an external memory such as an EPROM is used, a user can choose whether to install the external memory.

[Patent document 1] Japanese Patent Application Publication No. 2002-14833
[Patent document 2] Japanese Patent Application Publication No. 2006-190132
[Patent document 3] Japanese Patent Application Publication No. 2002-24159

Thus, using an external memory such as an EPROM is a simple but effective way to reinstall programs. However, to use an external memory, it is necessary to provide additional terminals or pins for connecting the external memory to the USB LSI. This may cause a problem when one reduces the size of a Web camera. One way to avoid an increase in the number of terminals or pins of a USB LSI is to use a serial electrically erasable programmable read-only memory (serial EEPROM) having a serial interface. However, since the data transfer rate of a serial EEPROM is very low and the start-up time of a USB device after power-on is very short, the amount of data that can be read from a serial EEPROM is limited.

DISCLOSURE OF THE INVENTION

Embodiments of the present invention provide a semiconductor integrated circuit, a system device including the semiconductor integrated circuit, and a method of controlling the semiconductor integrated circuit that solve or reduce one or more problems caused by the limitations and disadvantages of the related art.

An embodiment of the present invention provides a semiconductor integrated circuit that interfaces an external circuit and a host for controlling the external circuit and obtains data used to interface the external circuit and the host from a rewritable external memory. The semiconductor integrated circuit includes external terminals to which an external signal line group is connected, the external signal line group including signal lines connecting the external circuit and the external memory in parallel; an external terminal interface circuit configured to interface the semiconductor integrated circuit and the external circuit or the external memory connected via the external signal line group; and a control circuit configured to activate or deactivate the external circuit and the external memory; wherein the control circuit is configured to activate either the external circuit or the external memory that is to be accessed via the external terminal interface circuit.

Another embodiment of the present invention provides a system device that includes an external circuit; a rewritable external memory; and a semiconductor integrated circuit configured to interface the external circuit and a host for controlling the external circuit and to obtain data used to interface the external circuit and the host from the external memory. The semiconductor integrated circuit includes external terminals to which an external signal line group is connected, the external signal line group including signal lines connecting the external circuit and the external memory in parallel, an external terminal interface circuit configured to interface the semiconductor integrated circuit and the external circuit or the external memory connected via the external signal line group, and a control circuit configured to activate or deactivate the external circuit and the external memory; wherein the control circuit is configured to activate either the external circuit or the external memory that is to be accessed via the external terminal interface circuit.

Still another embodiment of the present invention provides a method of controlling a semiconductor integrated circuit that interfaces an external circuit and a host for controlling the external circuit and obtains data used to interface the external circuit and the host from a rewritable external memory. The method includes the step of activating either the external circuit or the external memory that is to be accessed, the external circuit and the external memory being connected in parallel by the same external signal line group to the semiconductor integrated circuit.

BEST MODE FOR CARRYING OUT THE INVENTION

Preferred embodiments of the present invention are described below with reference to the accompanying drawings.

First Embodiment

Figure 1:
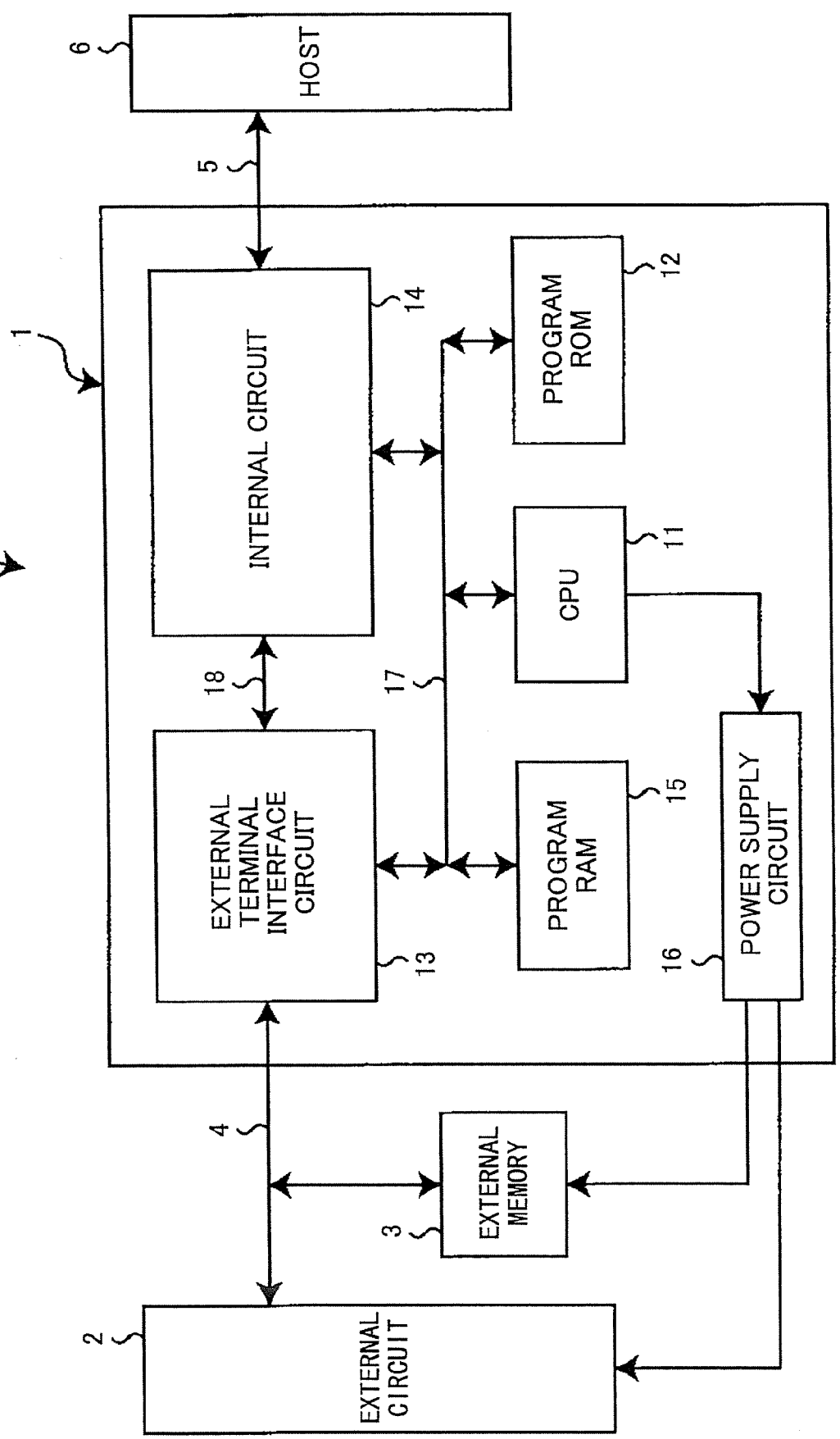
FIG. 1 is a block diagram illustrating an exemplary configuration of a system device including a semiconductor integrated circuit 1 according to a first embodiment of the present invention.

FIG. 1 is a block diagram illustrating an exemplary configuration of a system device 10 including a semiconductor integrated circuit 1 according to a first embodiment of the present invention.

As shown in FIG. 1, the system device 10 includes the semiconductor integrated circuit 1, an external circuit 2, and an external memory 3 that is a rewritable memory such as an EPROM. The semiconductor integrated circuit 1 includes external terminals (not shown) for connecting signal lines. The external circuit 2 and the external memory 3 are connected in parallel by an external signal line group 4 comprising multiple signal lines connected to the corresponding external terminals.

For example, a data signal output from the semiconductor integrated circuit 1 to the external signal line group 4 enters the external circuit 2 or the external memory 3. The semiconductor integrated circuit 1 is also connected to a host 6 such as a personal computer (hereafter called a PC) via an external signal line group 5 such as a USB. The semiconductor integrated circuit 1 controls power supplied to the external circuit 2 and the external memory 3. When inputting/outputting data from/to the external circuit 2 via the external signal line group 4, the semiconductor integrated circuit 1 supplies power only to the external circuit 2. When inputting/outputting data from/to the external memory 3 via the external signal line group 4, the semiconductor integrated circuit 1 supplies power only to the external memory 3.

The semiconductor integrated circuit 1 also includes a CPU 11, a program ROM 12, an external terminal interface circuit 13, an internal circuit 14 including an interface for connecting the semiconductor integrated circuit 1 to the host 6, a program RAM 15, and a power supply circuit 16. The program ROM 12 contains a preinstalled program(s) to be executed by the CPU 11. The program RAM 15 stores programs and data used by the CPU 11 to access the external circuit 2 and is configured to allow addition and modification of programs and data. The external terminal interface circuit 13 functions as an interface for connecting the semiconductor integrated circuit 1 to the external circuit 2 and the external memory 3.

The CPU 11, the program ROM 12, the external terminal interface circuit 13, the internal circuit 14, and the program RAM 15 are connected to each other via an internal signal line group 17. Also, the external terminal interface circuit 13 and the internal circuit 14 are connected via an internal signal line group 18. The CPU 11 controls the power supply circuit 16 and thereby controls power supplied to the external circuit 2 and the external memory 3. In the configuration shown in FIG. 1, the external terminal interface circuit 13 corresponds to an external terminal interface circuit, the program RAM 15 corresponds to an internal volatile memory, the program ROM 12 corresponds to an internal nonvolatile memory, and the CPU 11 and the program ROM 12 correspond to a control circuit.

When the semiconductor integrated circuit 1 inputs/outputs data from/to the external circuit 2, the CPU 11 causes the power supply circuit 16 to cut off power to the external memory 3 and to supply power to the external circuit 2 according to a program stored in the program ROM 12. The CPU 11 thereby activates and then accesses the external circuit 2.

When the semiconductor integrated circuit 1 inputs/outputs data from/to the external memory 3, the CPU 11 causes the power supply circuit 16 to cut off power to the external circuit 2 and to supply power to the external memory 3 according to a program stored in the program ROM 12. The CPU 11 thereby activates the external memory 3 and then accesses the external memory 3 and the program RAM 15.

In a process of writing data to the external memory 3, the CPU 11 writes data such as a program, which is input to the internal circuit 14 from the host 6 via the external signal line group 5, to the external memory 3 via the internal signal line group 17, the external terminal interface circuit 13, and the external signal line group 4. In a process of transferring data in the external memory 3 to the program RAM 15, the CPU 11 reads data from the external memory 3 and writes the data to the program RAM 15 via the external signal line group 4, the external terminal interface circuit 13, and the internal signal line group 17.

Figure 2:
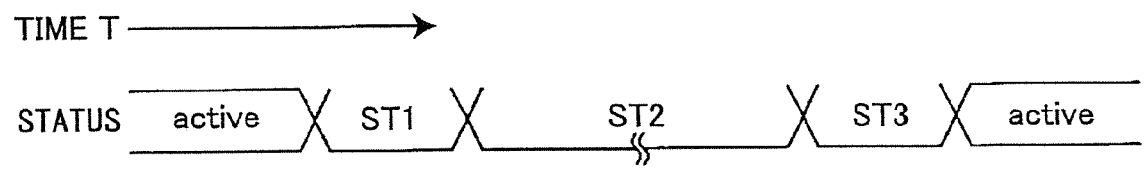
FIG. 2 is a timing diagram illustrating a process by which the semiconductor integrated circuit 1 shown in FIG. 1 inputs and outputs data from and to an external memory 3.

FIG. 2 is a timing diagram illustrating a process where the semiconductor integrated circuit 1 inputs and outputs data from and to the external memory 3.

In the active period shown in FIG. 2, the CPU 11 supplies power to the external circuit 2 and cuts off power to the external memory 3. As a result, the external circuit 2 is enabled to input/output data and the external memory 3 is deactivated. In the active period, the semiconductor integrated circuit 1 inputs and outputs signals from and to the external circuit 2 via the external signal line group 4. In the next period ST1, the CPU 11 cuts off power to the external circuit 2 and then supplies power to the external memory 3. As a result, the external circuit 2 is deactivated and the external memory 3 is enabled to input/output data.

In the subsequent period ST2, the CPU 11 transfers data between the external memory 3 and the program RAM 15. In the period ST3 following the period ST2, the CPU 11 cuts off power to and thereby deactivates the external memory 3 and resumes power supply to the external circuit 2 to return to the active period.

Thus, the semiconductor integrated circuit 1 can download programs and data necessary to access the external circuit 2 from the external memory 3 to the internal program RAM 15 without using dedicated terminals or signal lines for connecting the external memory 3.

Figure 3:
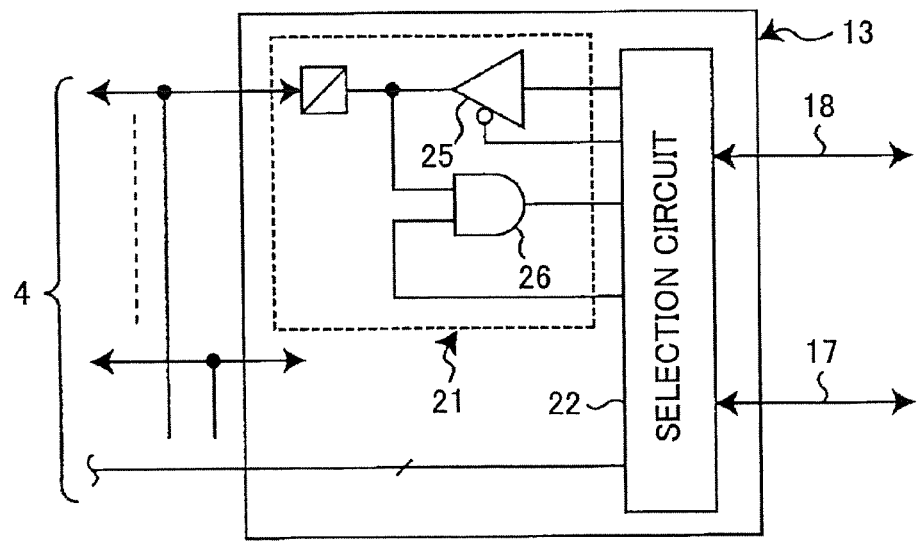
FIG. 3 is a circuit diagram illustrating a part of an exemplary internal configuration of an external terminal interface circuit 13 shown in FIG. 1.

FIG. 3 is a circuit diagram illustrating a part of an exemplary internal configuration of the external terminal interface circuit 13 shown in FIG. 1.

The external terminal interface circuit 13 includes multiple I/O cells 21 and selection circuits 22. Each I/O cell 21 includes a buffer 25 and an AND circuit 26. In FIG. 3, only one I/O cell 21 is shown for descriptive purposes. Other I/O cells 21 have substantially the same configuration as that shown in FIG. 3. The internal signal line groups 17 and 18 are connected to the selection circuit 22. The selection circuit 22 connects either the internal signal line group 17 or 18 via the I/O cell 21 to the external signal line group 4 according to control signals from the CPU 11. An input terminal of the buffer 25 and an output terminal of the AND circuit 26 are connected to the selection circuit 22, an output terminal of the buffer 25 is connected to one input terminal of the AND circuit 26, and a connecting terminal of the I/O cell 21 is connected to the corresponding signal line of the external signal line group 4. The CPU 11 sends control signals to a control signal input terminal of the buffer 25 and the other input terminal of the AND circuit 26 and thereby opens or closes the gates implemented by the buffer 25 and the AND circuit 26.

When outputting a signal through the external terminal interface circuit 13 to the external signal line group 4, the CPU 11 outputs a low-level signal to the control signal input terminal of the buffer 25 to turn on the buffer 25, outputs a low-level signal to one of the input terminals of the AND circuit 26, and thereby causes the signal at the output terminal of the AND circuit 26 to fall to the low level. As a result, a signal input via the internal signal line group 17 or 18 connected to the selection circuit 22 is output via the buffer 25 to the external signal line group 4.

For example, when writing data such as a program to the external memory 3, which data is input to the internal circuit 14 from the host 6 via the external signal line group 5, the CPU 11 cuts off power to the external circuit 2 and supplies power to the external memory 3 as described above, and causes the selection circuit 22 to connect the internal signal line group 17 to the I/O cell 21. Then, the CPU 11 turns on the buffer 25 and causes the AND circuit 26 to close its gate. When outputting a data signal to the external circuit 2, which data signal is input to the internal circuit 14 from the host 6 via the external signal line group 5, the CPU 11 supplies power to the external circuit 2 and cuts off power to the external memory 3 as described above, and causes the selection circuit 22 to connect the internal signal line group 17 to the I/O cell 21. Then, the CPU 11 turns on the buffer 25 and causes the AND circuit 26 to close its gate.

When a signal is input from the external signal line group 4 to the external terminal interface circuit 13, the CPU 11 outputs a high-level signal to the control signal input terminal of the buffer 25 to turn off and close the buffer 25 and outputs a high-level signal to one of the input terminals of the AND circuit 26 to cause the AND circuit 26 to open its gate. As a result, a signal from the external signal line group 4 is input via the AND circuit 26 to the selection circuit 22 and then output to the internal signal line group 17 or 18.

For example, when transferring data from the external memory 3 to the program RAM 15, the CPU 11 cuts off power to the external circuit 2 and supplies power to the external memory 3 as described above, and causes the selection circuit 22 to connect the internal signal line group 17 to the I/O cell 21. Then, the CPU 11 turns off the buffer 25 and causes the AND circuit 26 to open its gate. When sending a signal from the external circuit 2 to the internal circuit 14, the CPU 11 supplies power to the external circuit 2 and cuts off power to the external memory 3 as described above, and causes the selection circuit 22 to connect the internal signal line group 18 to the I/O cell 21. Then, the CPU 11 turns off the buffer 25 and causes the AND circuit 26 to open its gate.

Figure 4:
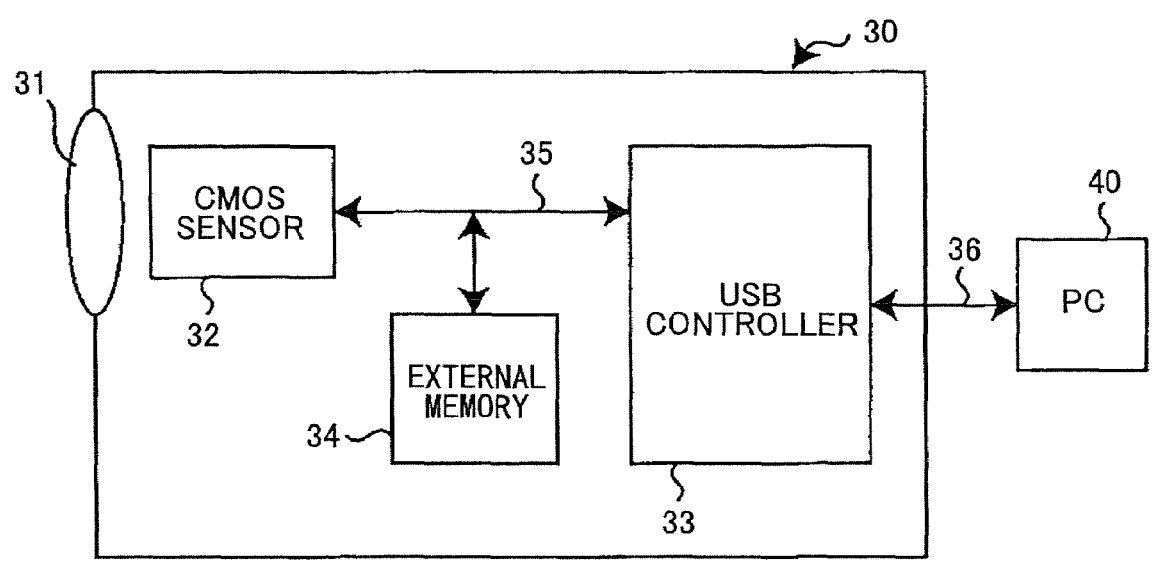
FIG. 4 is a block diagram illustrating an exemplary configuration of a Web camera including the semiconductor integrated circuit 1 shown in FIG. 1.

FIG. 4 is a block diagram illustrating an exemplary configuration of a Web camera including the semiconductor integrated circuit 1 shown in FIG. 1.

As shown in FIG. 4, a Web camera 30 includes an optical lens 31, a CMOS sensor 32, a USB controller 33, and an external memory 34. The USB controller 33 includes external terminals (not shown) for connecting signal lines. The CMOS sensor 32 and the external memory 34 are connected in parallel by an external signal line group 35 comprising multiple signal lines connected to the corresponding external terminals. The USB controller 33 is also connected via a USB 36 to a PC 40. A CCD sensor may be used in place of the CMOS sensor 32. The Web camera 30 corresponds to the system device 10 of FIG. 1, the CMOS sensor 32 corresponds to the external circuit 2 of FIG. 1, the USB controller 33 corresponds to the semiconductor integrated circuit 1 of FIG. 1, the external memory 34 corresponds to the external memory 3 of FIG. 1, and the external signal line group 35 corresponds to the external signal line group 4. Also, the USB 36 corresponds to the external signal line group 5 of FIG. 1 and the PC 40 corresponds to the host 6 of FIG. 1.

Figure 5:
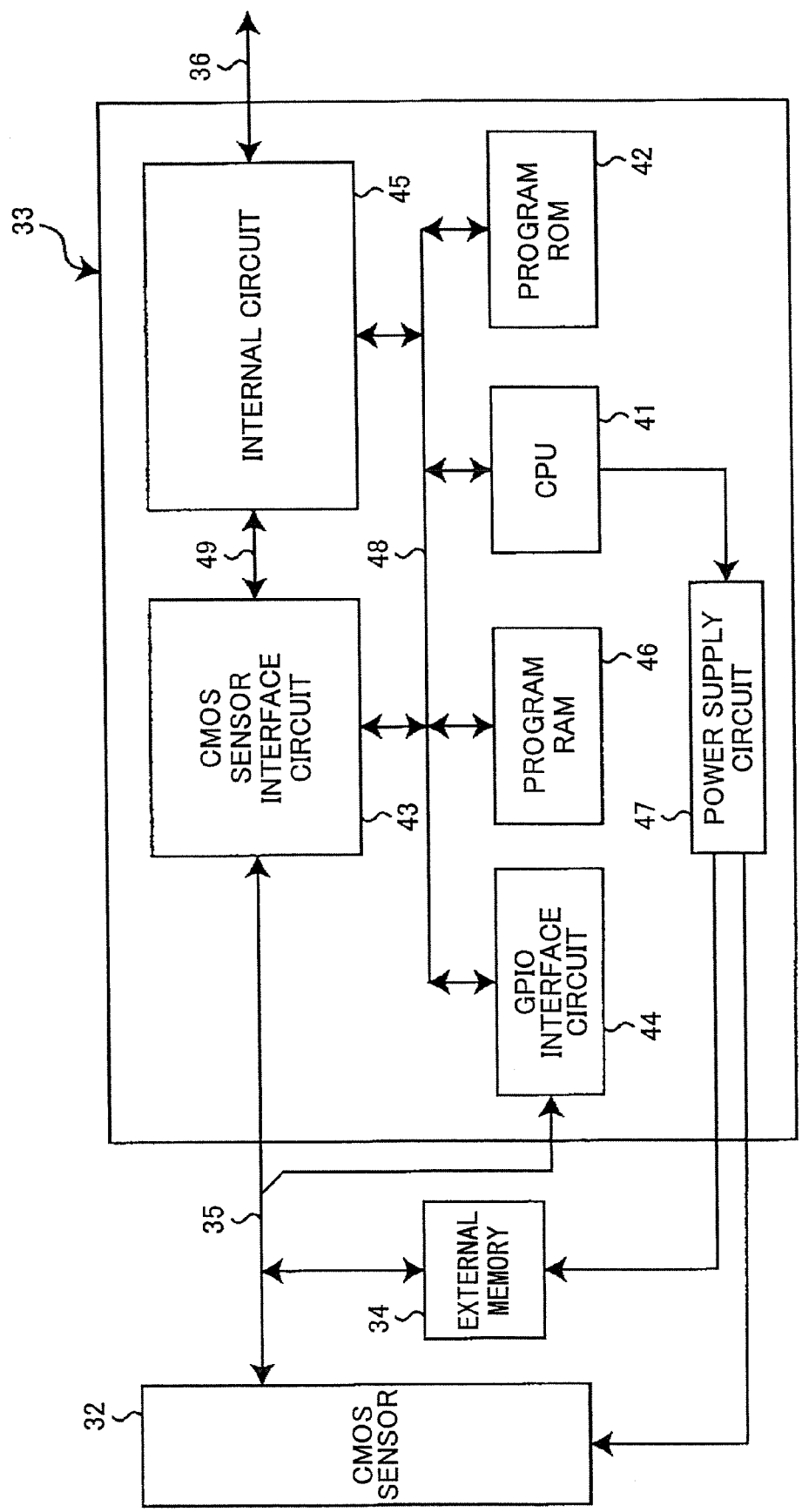
FIG. 5 is a block diagram illustrating an exemplary internal configuration of a USB controller 33 shown in FIG. 4.

FIG. 5 is a block diagram illustrating an exemplary internal configuration of the USB controller 33 shown in FIG. 4.

As shown in FIG. 5, the USB controller 33 includes a CPU 41, a program ROM 42, a CMOS sensor interface circuit 43, a general purpose input/output (GPIO) interface circuit 44, an internal circuit 45 including an image data FIFO and a USB interface circuit, a program RAM 46, and a power supply circuit 47. The CPU 41 corresponds to the CPU 11 of FIG. 1, the program ROM 42 to the program ROM 12, the CMOS sensor interface circuit 43 and the GPIO interface circuit 44 to the external terminal interface circuit 13, the internal circuit 45 to the internal circuit 14, the program RAM 46 to the program RAM 15, and the power supply circuit 47 to the power supply circuit 16.

The program ROM 42 contains a preinstalled program(s) to be executed by the CPU 41. The program RAM 46 stores programs and data used by the CPU 41 to access the CMOS sensor 32 and is configured to allow addition and modification of programs and data. The CMOS sensor interface circuit 43 functions as an interface for connecting the USB controller 33 to the CMOS sensor 32 and the external memory 34. The GPIO interface circuit 44 functions as an interface for connecting peripheral devices of the Web camera 30.

The CPU 41, the program ROM 42, the CMOS sensor interface circuit 43, the GPIO interface circuit 44, the internal circuit 45, and the program RAM 46 are connected via an internal signal line group 48.

The CMOS sensor interface circuit 43 is connected via an internal signal line group 49 to the internal circuit 45. Also, the CMOS sensor interface circuit 43 is connected via the external signal line group 35 to the external memory 34 and the CMOS sensor 32, and the GPIO interface circuit 44 is connected via the external signal line group 35 to the external memory 34. Further, the internal circuit 45 is connected via the USB 36 to the PC 40. The internal circuit 45 includes an interface for connecting the USB controller 33 to the PC 40. The internal signal line group 48 corresponds to the internal signal line group 17 of FIG. 1 and the internal signal line group 49 corresponds to the internal signal line group 18 of FIG. 1. The power supply circuit 47 lowers a voltage supplied from the PC 40 via the USB 36 and outputs the lowered voltage. The CPU 41 controls the power supply circuit 47 and thereby controls power supplied to the CMOS sensor 32 and to the external memory 34.

When the USB controller 33 inputs/outputs a signal from/to the CMOS sensor 32, the CPU 41 causes the power supply circuit 47 to cut off power to the external memory 34 and to supply power to the CMOS sensor 32 according to a program stored in the program ROM 42. The CPU 11 thereby activates and then accesses the CMOS sensor 32.

When the USB controller 33 inputs/outputs data from/to the external memory 34, the CPU 41 causes the power supply circuit 47 to cut off power to the CMOS sensor 32 and to supply power to the external memory 34 according to a program stored in the program ROM 42. The CPU 11 thereby activates the external memory 34 and then accesses the external memory 34 and the program RAM 46.

In a process of writing data to the external memory 34, the CPU 41 writes data, which are input to the internal circuit 45 from the PC 40 via the USB 36, to the external memory 34 via the internal signal line group 48, the CMOS sensor interface circuit 43, the GPIO interface circuit 44, and the external signal line group 35. In a process of transferring data in the external memory 34 to the program RAM 46, the CPU 41 reads data from the external memory 34 and writes the data to the program RAM 46 via the external signal line group 35, the CMOS sensor interface circuit 43, the GPIO interface circuit 44, and the internal signal line group 48.

Figure 6:
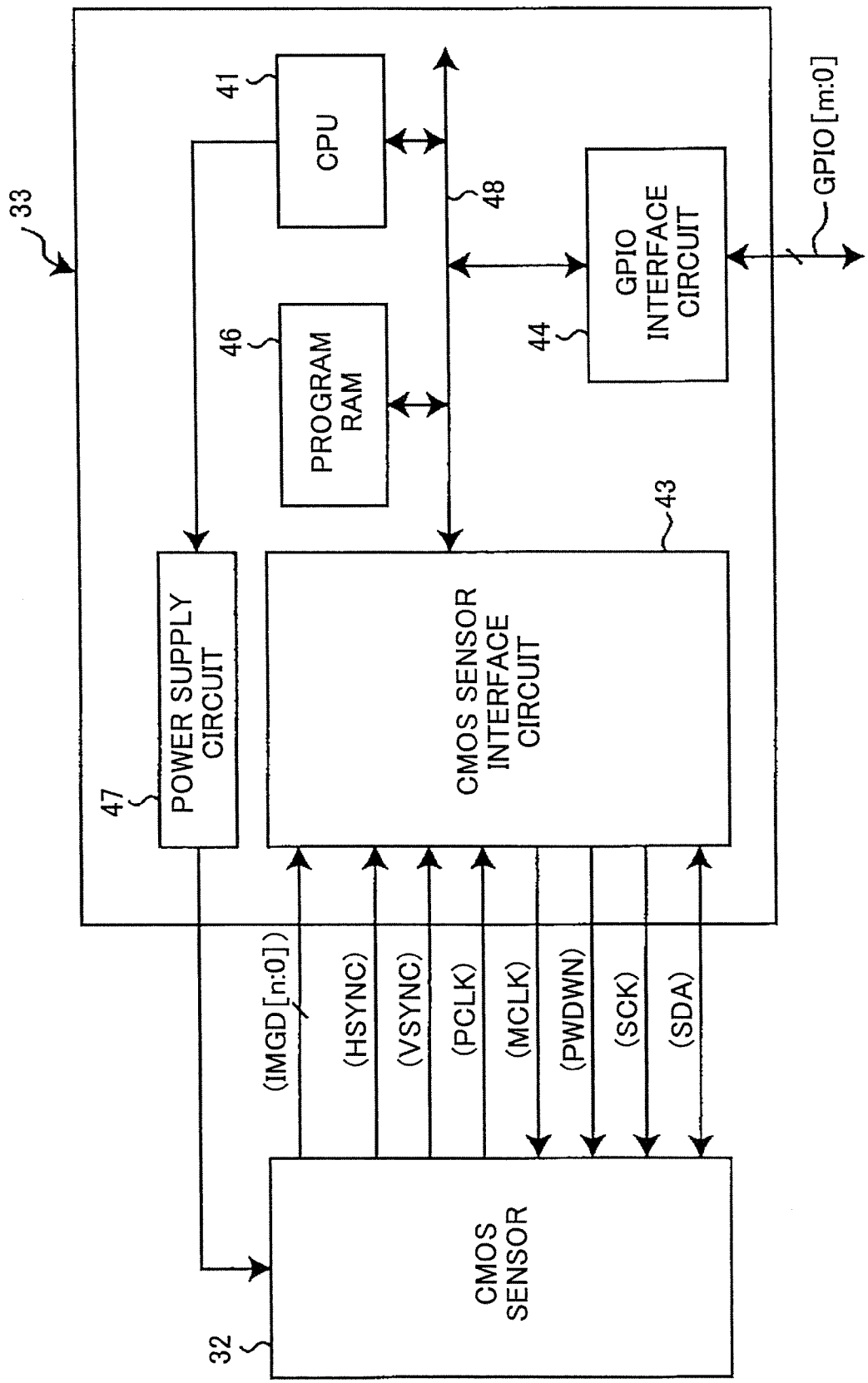
FIG. 6 is a drawing illustrating a detailed example of an external signal line group 35 shown in FIG. 5.

FIG. 6 is a drawing illustrating a detailed example of the external signal line group 35.

As shown in FIG. 6, the external signal line group 35 includes the following signal lines for sending signals from the CMOS sensor 32 to the CMOS sensor interface circuit 43: signal lines for sending input image data IMGD [n:0] having a width of (n+1) bits; signal lines for sending signals HSYNC and VSYNC indicating a validity period of image data; and a signal line for sending a clock signal PCLK with which the input image data IMGD [n:0] and the signals HSYNC and VSYNC are synchronized. The external signal line group 35 also includes the following signal lines for sending signals from the CMOS sensor interface circuit 43 to the CMOS sensor 32: a signal line for sending an original clock signal MCLK used to generate a clock signal in the CMOS sensor 32; a signal line for sending a reset signal PWDWN used to reset the CMOS sensor 32, and signal lines for sending a clock signal SCK and serial data SDA used for serial communications to access a register (not shown) in the CMOS sensor 32. The external signal line group 35 further includes (m+1) signal lines GPIO [m:0] for connecting peripheral devices of the Web camera 30 to the GPIO interface circuit 44.

Figure 7:
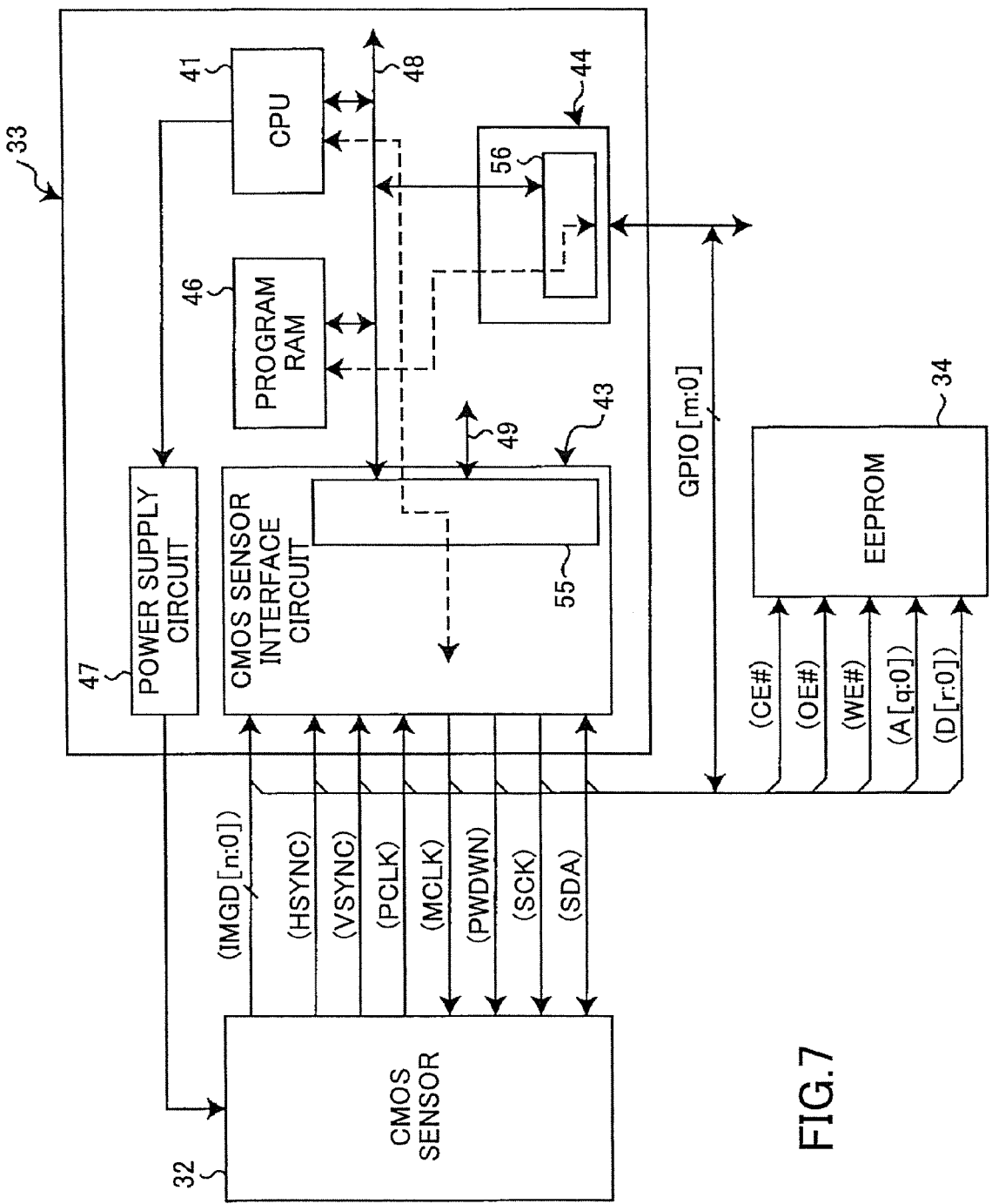
FIG. 7 is a drawing illustrating a detailed example of the external signal line group 35 when an EEPROM is used as an external memory 34.

FIG. 7 is a drawing illustrating a detailed example of the external signal line group 35 when an EEPROM is used as the external memory 34.

As shown in FIG. 7, an EEPROM 34 is connected by signal lines that send an access authorization (chip enable) signal CE#, a read (output enable) signal OE#, a write (write enable) signal WE#, address data A [q:0] having a width of (q+1) bits, and data D [r:0] having a width of (r+1) bits. The width of the data D is normally 8 bits. Therefore, when the capacity of the EEPROM 34 is 8 KB, the width of the address data A becomes 13 bits and the total number of signal lines for the EEPROM 34 becomes 24. In this case, for example, n is set at 7 and m is set at 8, and the number of signal lines of the external signal line group 35 becomes 24. If signal lines other than those mentioned above are available between the CMOS sensor 32 and the CMOS sensor interface circuit 43, those signal lines may also be used for connecting the EEPROM 34.

The CMOS sensor interface circuit 43 includes a selection circuit 55 and the GPIO interface circuit 44 includes a selection circuit 56. The selection circuit 55 connects either the internal signal line group 48 or 49 to the external signal line group 35 according to control signals from the CPU 41. When the CPU 41 controls a peripheral device connected to the GPIO interface circuit 44, the CPU 41 is connected via a register (not shown) to the GPIO interface circuit 44. The selection circuit 56 connects the signal lines GPIO [m:0] either to the internal signal line group 48 or the register according to a control signal from the CPU 41.

When inputting or outputting signals from or to the CMOS sensor 32, the CPU 41 causes the selection circuit 55 to connect the internal signal line group 49 to signal lines of the external signal line group 35 other than the signal lines GPIO

[m:0] and causes the selection circuit 56 to connect the signal lines GPIO [m:0] to the register. When writing data such as a program to the EEPROM 34 or transferring data in the EEPROM 34 to the program RAM 46, the CPU 41 causes the selection circuit 55 or 56 to connect the internal signal line group 48 to the external signal line group 35.

Figure 8:
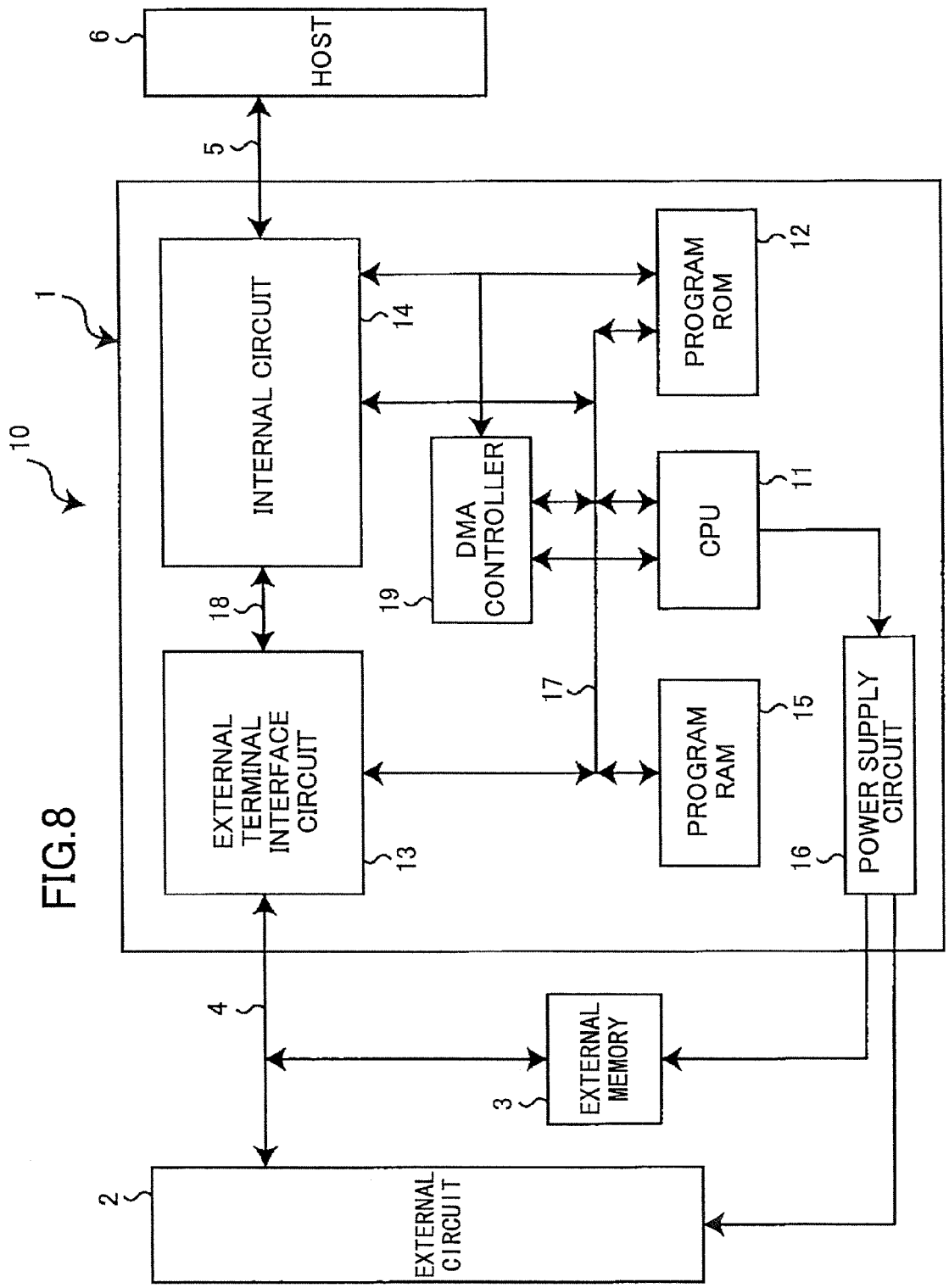
FIG. 8 is a block diagram illustrating another exemplary configuration of a system device including the semiconductor integrated circuit 1 according to the first embodiment of the present invention.

In the example shown in FIG. 1, data are transferred by the CPU 11 between the external memory 3 and the program RAM 15. Alternatively, a direct memory access (DMA) controller 19 may be used to speed up the data transfer as shown in FIG. 8. The DMA controller 19 manages the direction of data transfer between the external memory 3 and the program RAM 15 and addresses where data are read or written. The CPU 11 requests the DMA controller 19 to start direct memory access (DMA) and waits for a DMA completion report from the DMA controller 19. Although the size of the semiconductor integrated circuit 1 becomes larger than that shown in FIG. 1, this configuration makes it possible to speed up data transfer. The external circuit 2 and the external memory 3 are switched in substantially the same manner as described above with reference to FIG. 1. In the configuration shown in FIG. 8, the CPU 11, the program ROM 12, and the DMA controller 19 constitute a control circuit.

In the above embodiment, the power supply circuit 16 is provided in the semiconductor integrated circuit 1. Alternatively, the power supply circuit 16 may be provided outside of the semiconductor integrated circuit 1.

As described above, the semiconductor integrated circuit 1 of the first embodiment can be connected to the external circuit 2 or the external memory 3 using the same external signal line group 4. When inputting/outputting data from/to the external circuit 2, the CPU 11 of the semiconductor integrated circuit 1 cuts off power to the external memory 3, supplies power to and thereby activates the external circuit 2, and then accesses the external circuit 2. When inputting/outputting data from/to the external memory 3, the CPU 11 of the semiconductor integrated circuit 1 cuts off power to the external circuit 2, supplies power to and thereby activates the external memory 3, and then accesses the external memory 3 and the program RAM 15. Thus, the first embodiment of the present invention makes it possible to make a semiconductor integrated circuit capable of downloading a program from an external memory to an internal RAM without increasing the number of pins and the size of the semiconductor integrated circuit.

Second Embodiment

The semiconductor integrated circuit 1 of the first embodiment described above is configured to be able to input/output signals from/to the external circuit 2 or the external memory 3 using the same external signal line group 4 by controlling power supply to the external circuit 2 and the external memory 3. In a second embodiment of the present invention, a semiconductor integrated circuit 1*a* is configured to be able to input/output signals from/to an external circuit 2*a* or an external memory 3*a* using the same external signal line group 4 by using control signals to control data input-output functions of the external circuit 2*a* and the external memory 3*a*.

Figure 9:
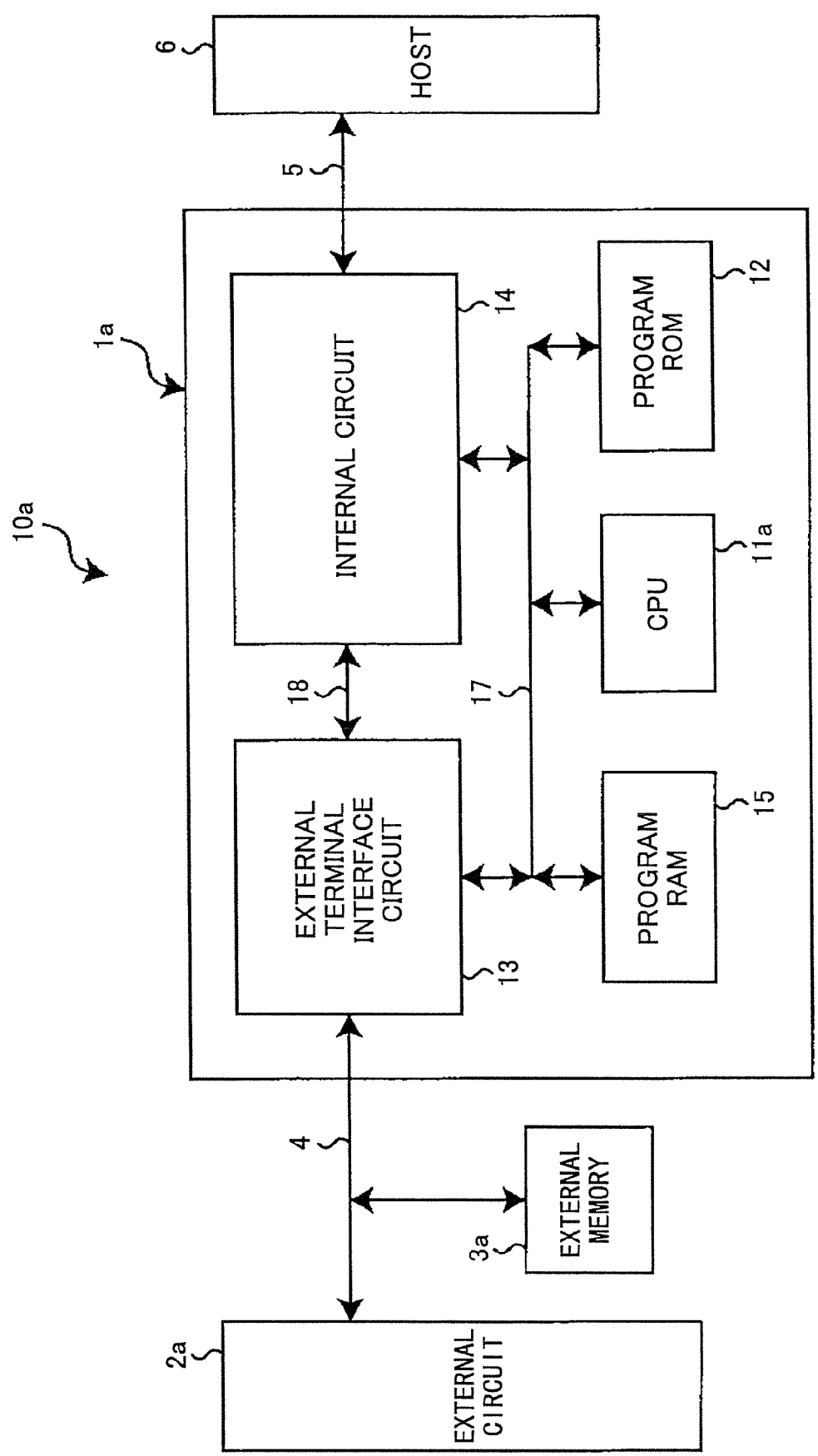
FIG. 9 is a block diagram illustrating an exemplary configuration of a system device including a semiconductor integrated circuit 1a according to a second embodiment of the present invention.

FIG. 9 is a block diagram illustrating an exemplary configuration of a system device 10*a* including the semiconductor integrated circuit 1*a* according to the second embodiment of the present invention. Components in FIG. 9 that correspond to those shown in FIG. 1 are assigned the same reference numbers and descriptions of those components are omitted. Here, differences between FIG. 1 and FIG. 9 are discussed.

In the exemplary configuration shown in FIG. 9, the system device 10 of FIG. 1 is renamed a system device 10*a*, the semiconductor integrated circuit 1 is renamed a semiconductor integrated circuit 1*a*, the CPU 11 is replaced with a CPU 11*a*, the external circuit 2 is replaced with an external circuit 2*a*, and the external memory 3 is replaced with an external memory 3*a*. Also, in FIG. 9, the power supply circuit 16 of FIG. 1 is removed and the CPU 11*a* is configured to control data input-output functions of the external circuit 2*a* and the external memory 3*a*.

As shown in FIG. 9, the system device 10*a* includes the semiconductor integrated circuit 1*a*, the external circuit 2*a*, and the external memory 3*a* that is a rewritable memory such as an EPROM.

The semiconductor integrated circuit 1*a* includes external terminals (not shown) for connecting signal lines. The external circuit 2*a* and the external memory 3*a* are connected in parallel by the external signal line group 4 comprising multiple signal lines connected to the corresponding external terminals. For example, a data signal output from the semiconductor integrated circuit 1*a* to the external signal line group 4 enters the external circuit 2*a* or the external memory 3*a*. The semiconductor integrated circuit 1*a* is also connected via the external signal line group 5 to the host 6. The semiconductor integrated circuit 1*a* controls data input-output functions of the external circuit 2*a* and the external memory 3*a*. When inputting/outputting data from/to the external circuit 2*a* via the external signal line group 4, the CPU 11*a* activates the input-output function of the external circuit 2*a* and deactivates the data input-output function of the external memory 3*a*. When inputting/outputting data from/to the external memory 3*a* via the external signal line group 4, the CPU 11*a* activates the data input-output function of the external memory 3*a* and deactivates the data input-output function of the external circuit 2*a*.

The semiconductor integrated circuit 1*a* also includes the CPU 11*a*, the program ROM 12, the external terminal interface circuit 13, the internal circuit 14 including an interface for connecting the semiconductor integrated circuit 1*a* to the host 6, and the program RAM 15. The program ROM 12 contains a preinstalled program(s) to be executed by the CPU 11*a*. The program RAM 15 stores programs and data used by the CPU 11*a* to access the external circuit 2*a* and is configured to allow addition and modification of programs and data. The external terminal interface circuit 13 includes an interface for connecting the semiconductor integrated circuit 1*a* to the external circuit 2*a* and the external memory 3*a*.

The CPU 11*a*, the program ROM 12, the external terminal interface circuit 13, the internal circuit 14, and the program RAM 15 are connected to each other via the internal signal line group 17. Also, the external terminal interface circuit 13 and the internal circuit 14 are connected to each other via the internal signal line group 18. In the configuration shown in FIG. 9, the CPU 11*a* and the program ROM 12 constitute a control circuit.

When the semiconductor integrated circuit 1*a* inputs/outputs data from/to the external circuit 2*a*, the CPU 11*a* deactivates the data input-output function of the external memory 3*a* and activates the input-output function of the external circuit 2*a* according to a program stored in the program ROM 12. The CPU 11*a* then accesses the external circuit 2*a*.

When the semiconductor integrated circuit 1*a* inputs/outputs data from/to the external memory 3*a*, the CPU 11*a* deactivates the data input-output function of the external circuit 2*a* and activates the input-output function of the external memory 3a according to a program stored in the program ROM 12. The CPU 11a then accesses the external memory 3a.

In a process of writing data to the external memory 3a, the CPU 11a writes data such as a program, which is input to the internal circuit 14 from the host 6 via the external signal line group 5, to the external memory 3a via the internal signal line group 17, the external terminal interface circuit 13, and the external signal line group 4. In a process of transferring data from the external memory 3a to the program RAM 15, the CPU 11a reads data from the external memory 3a and writes the data to the program RAM 15 via the external signal line group 4, the external terminal interface circuit 13, and the internal signal line group 17.

Figure 10:
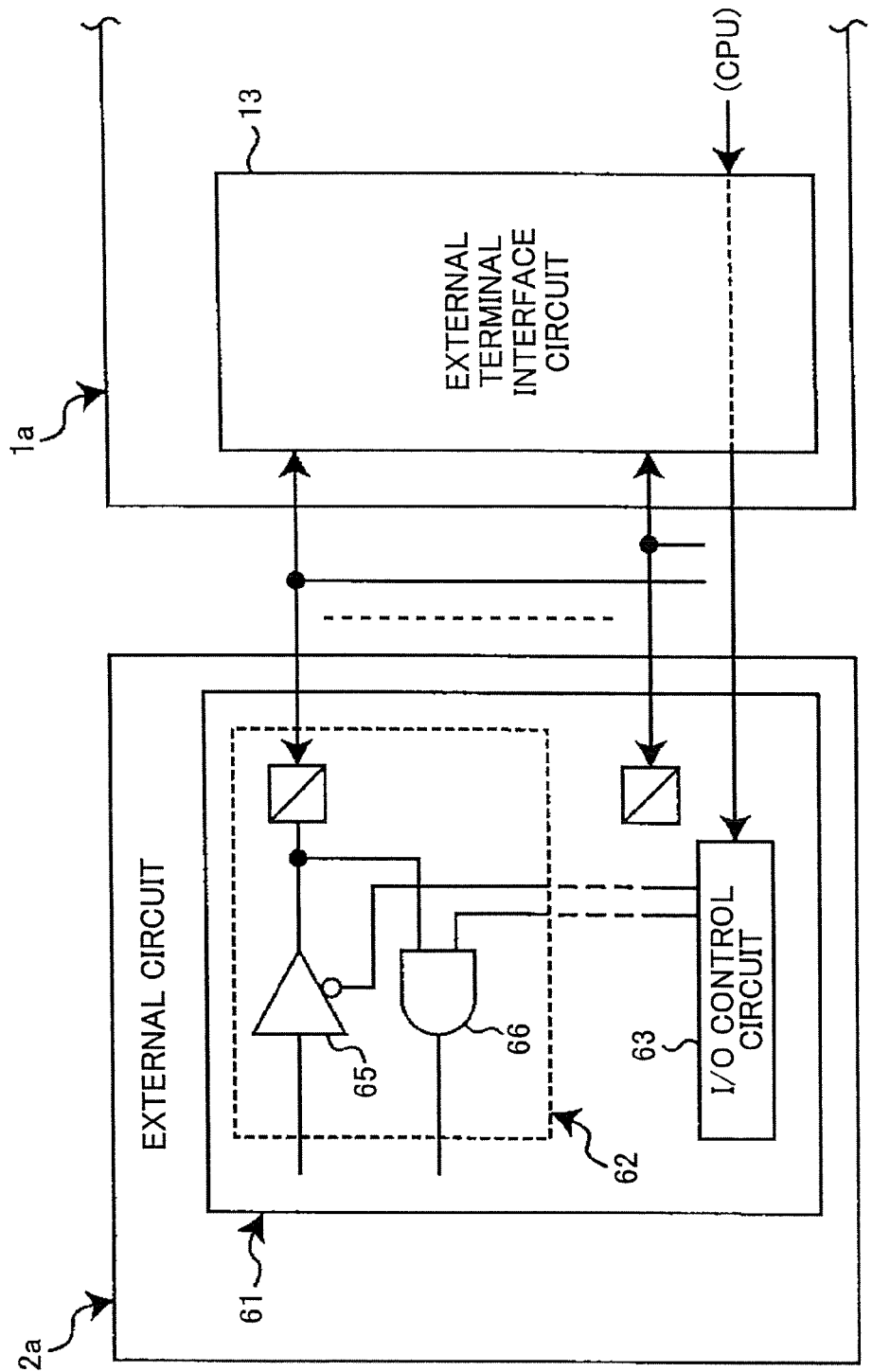
FIG. 10 is a circuit diagram illustrating a part of an exemplary internal configuration of an external circuit 2a shown in FIG. 9.

FIG. 10 is a circuit diagram illustrating a part of an exemplary internal configuration of the external circuit 2a shown in FIG. 9.

The external circuit 2a includes an I/O interface circuit 61. The I/O interface circuit 61 includes multiple I/O cells 62 and an I/O control circuit 63 for controlling the I/O cells 62. The I/O cells 62 and the I/O control circuit 63 are connected to the external signal line group 4. Each of the I/O cells 62 includes a buffer 65 and an AND circuit 66. In FIG. 10, only one I/O cell 62 is shown for descriptive purposes. Other I/O cells 62 have substantially the same configuration as that shown in FIG. 10. A control signal is input from the CPU 11a to the I/O control circuit 63 via the external terminal interface circuit 13 and the external signal line group 4. Similarly, a control signal is input from the CPU 11a to the external memory 3a via the external terminal interface circuit 13 and the external signal line group 4. The input terminal of the buffer 65 and the output terminal of the AND circuit 66 are connected to corresponding circuits (not shown) in the external circuit 2a, the output terminal of the buffer 65 is connected to one input terminal of the AND circuit 66, and the connecting terminal of the I/O cell 62 is connected to the corresponding signal line of the external signal line group 4. The I/O control circuit 63 outputs control signals to the control signal input terminal of the buffer 65 and the other input terminal of the AND circuit 66 and thereby opens or closes the gates implemented by the buffer 65 and the AND circuit 66.

When outputting a signal from the external circuit 2a to the external signal line group 4, the I/O control circuit 63 outputs a low-level signal to the control signal input terminal of the buffer 65 to turn on the buffer 65, outputs a low-level signal to one of the input terminals of the AND circuit 66, and thereby causes the signal at the output terminal of the AND circuit 66 to fall to the low level. As a result, a signal is output via the buffer 65 to the external signal line group 4.

For example, when writing data such as a program, which is input to the internal circuit 14 from the host 6 via the external signal line group 5, to the external memory 3a or when transferring data from the external memory 3a to the program RAM 15, the CPU 11a deactivates the data input-output function of the external circuit 2a and activates the data input-output function of the external memory 3a as described above.

When inputting a signal from the external circuit 2a, the CPU 11a deactivates the data input-output function of the external memory 3a, turns on the buffer 65, and causes the AND circuit 66 to close its gate. When outputting a signal to the external circuit 2a, the CPU 11a deactivates the data input-output function of the external memory 3a, outputs a high-level signal to the control signal input terminal of the buffer 65 to turn off and close the buffer 65, and outputs a high-level signal to one of the input terminals of the AND circuit 66 to cause the AND circuit 66 to open its gate. As a result, a signal sent via the external signal line group 4 is input via the AND circuit 66 to an internal circuit of the external circuit 2a. In the descriptions above, the data input-output function of the external circuit 2a is deactivated when inputting/outputting data from/to the external memory 3a. Alternatively, the semiconductor integrated circuit 1a may be configured to deactivate all functions of the external circuit 2a when exchanging data with the external memory 3a.

Figure 11:
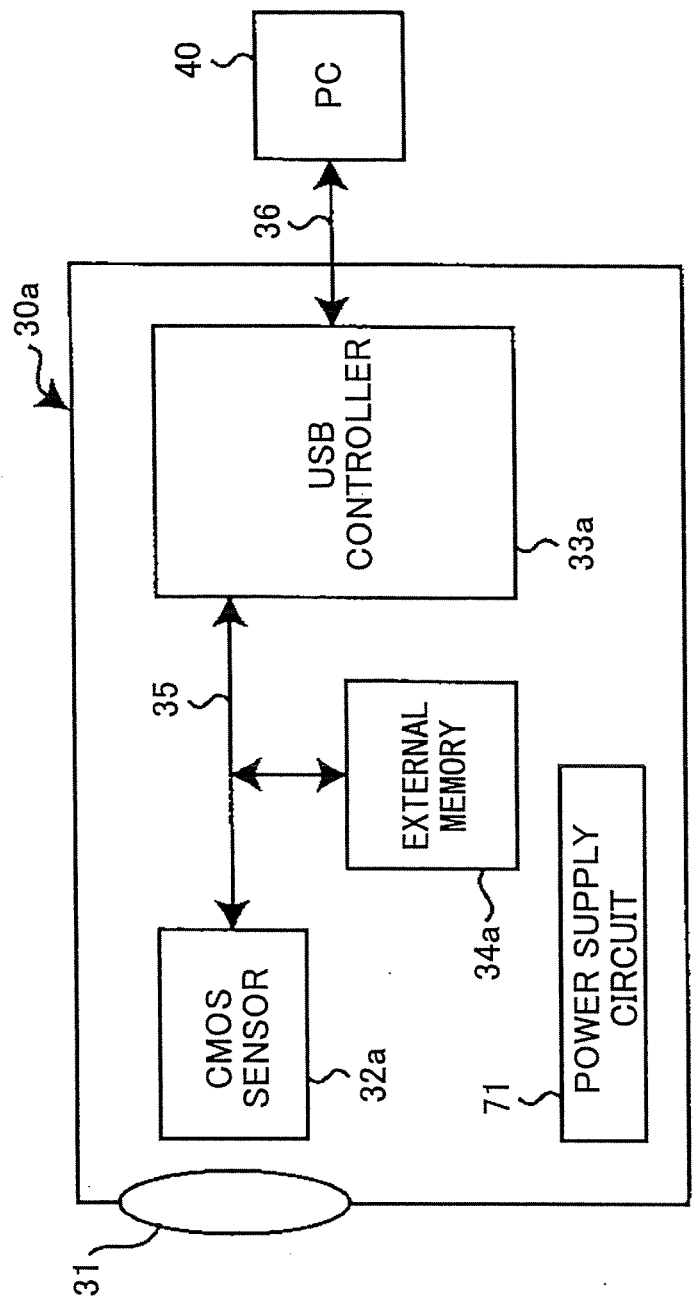
FIG. 11 is a block diagram illustrating an exemplary configuration of a Web camera including the semiconductor integrated circuit 1a shown in FIG. 9.

FIG. 11 is a block diagram illustrating an exemplary configuration of a Web camera including the semiconductor integrated circuit 1a shown in FIG. 9. Components in FIG. 11 that correspond to those shown in FIG. 4 are assigned the same reference numbers. As shown in FIG. 11, a Web camera 30a includes an optical lens 31, a CMOS sensor 32a, a USB controller 33a, an external memory 34a, and a power supply circuit 71. The power supply circuit 71 supplies power to the CMOS sensor 32a, the USB controller 33a, and the external memory 34a.

The CMOS sensor 32a, the USB controller 33a, and the external memory 34a are connected to each other via an external signal line group 35. The USB controller 33a is also connected via a USB 36 to a PC 40. A CCD sensor may be used in place of the CMOS sensor 32a. The Web camera 30a corresponds to the system device 10a of FIG. 9, the CMOS sensor 32a to the external circuit 2a, the USB controller 33a to the semiconductor integrated circuit 1a, the external memory 34a to the external memory 3a, and the external signal line group 35 to the external signal line group 4. Also, the USB 36 corresponds to the external signal line group 5 of FIG. 9 and the PC 40 corresponds to the host 6 of FIG. 9.

The internal configuration of the USB controller 33a of FIG. 11 is substantially the same as that shown in FIG. 5 except that the power supply circuit 47 is removed. Also, components of the external signal line group 35 are substantially the same as those shown in FIGS. 6 and 7. Therefore, figures illustrating the internal configuration of the USB controller 33a and the components of the external signal line group 35 are omitted here. In this example, it is assumed that an EEPROM is used as the external memory 34a (hereafter may also be called an EEPROM 34a). The CPU 11a of the USB controller 33a controls the CMOS sensor 32a using a reset signal PWDWN and controls the EEPROM 34a using a chip enable signal CE#. When accessing the EEPROM 34a, the CPU 11a activates the EEPROM 34a using the chip enable signal CE# and deactivates the CMOS sensor 32a using the reset signal PWDWN. On the other hand, when accessing the CMOS sensor 32a, the CPU 11a deactivates the EEPROM 34a using the chip enable signal CE# and activates the CMOS sensor 32a using the reset signal PWDWN.

Figure 12:
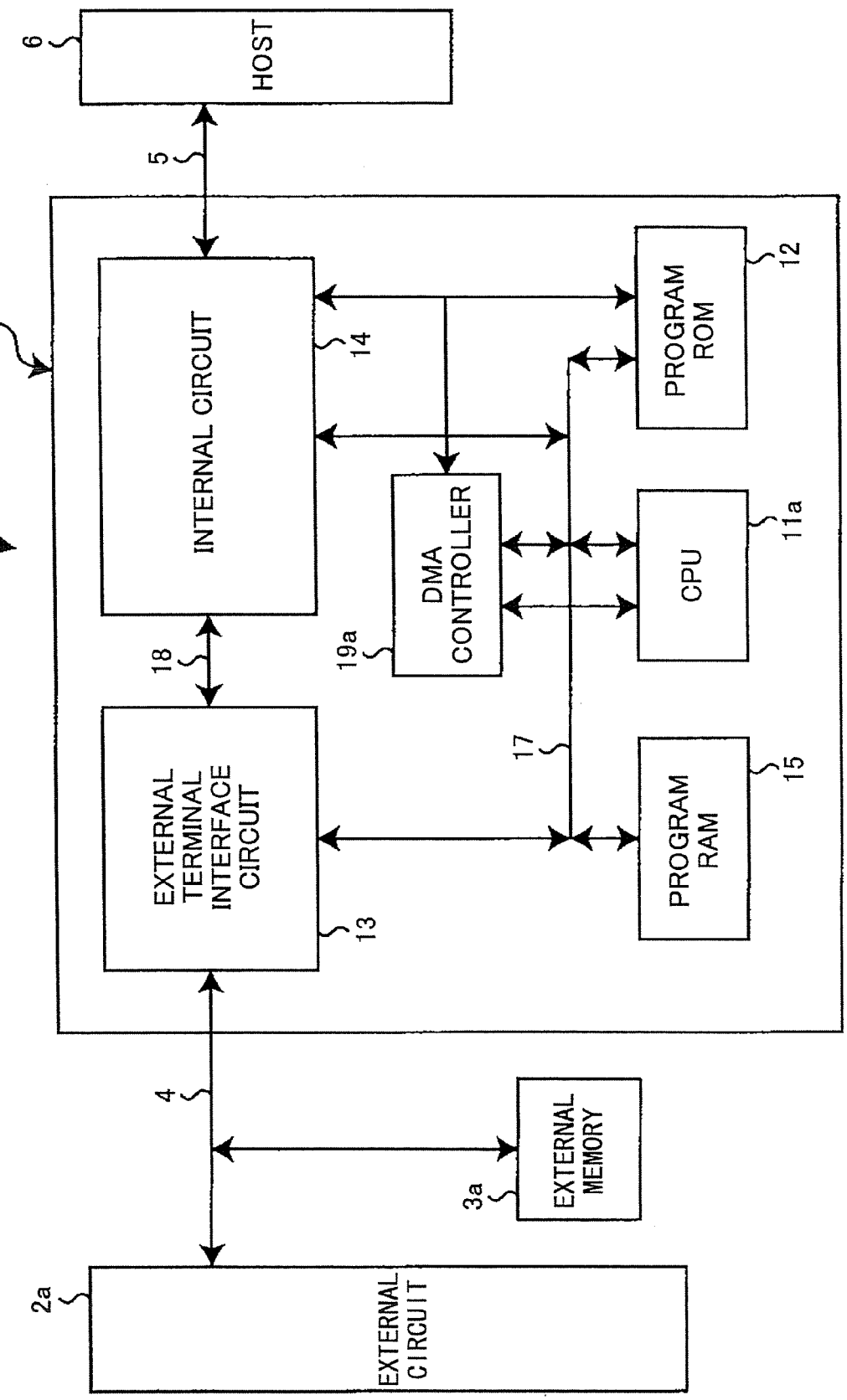
FIG. 12 is a block diagram illustrating another exemplary configuration of a system device including the semiconductor integrated circuit 1a according to the second embodiment of the present invention.
Figure 13:
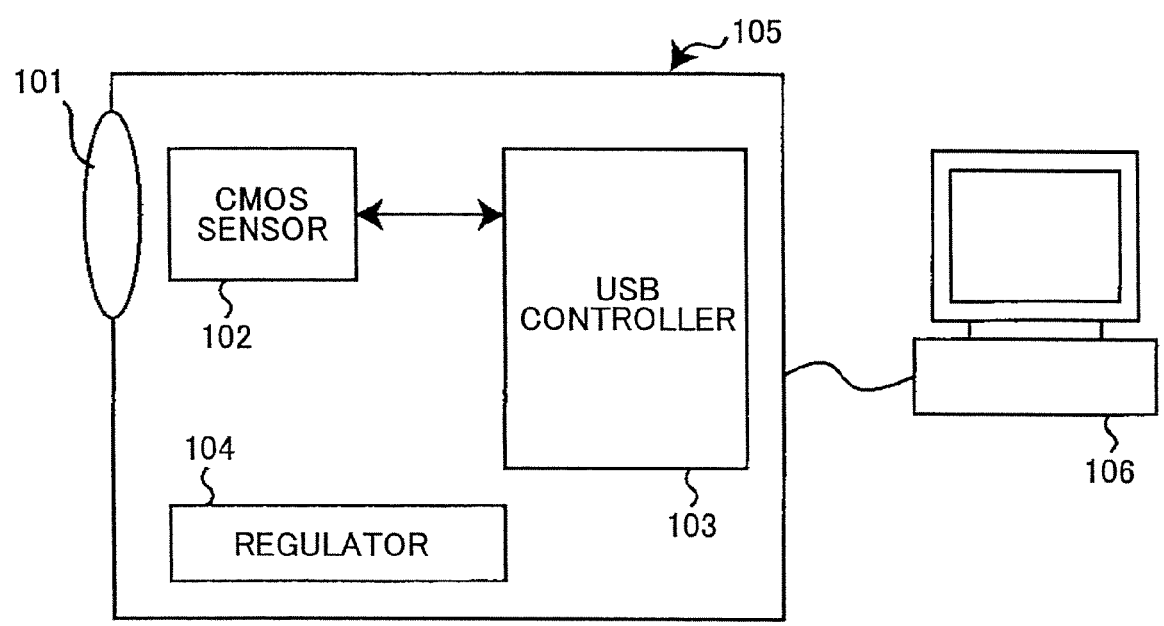
FIG. 13 is a drawing illustrating an exemplary configuration of a conventional Web camera system.
Figure 14:
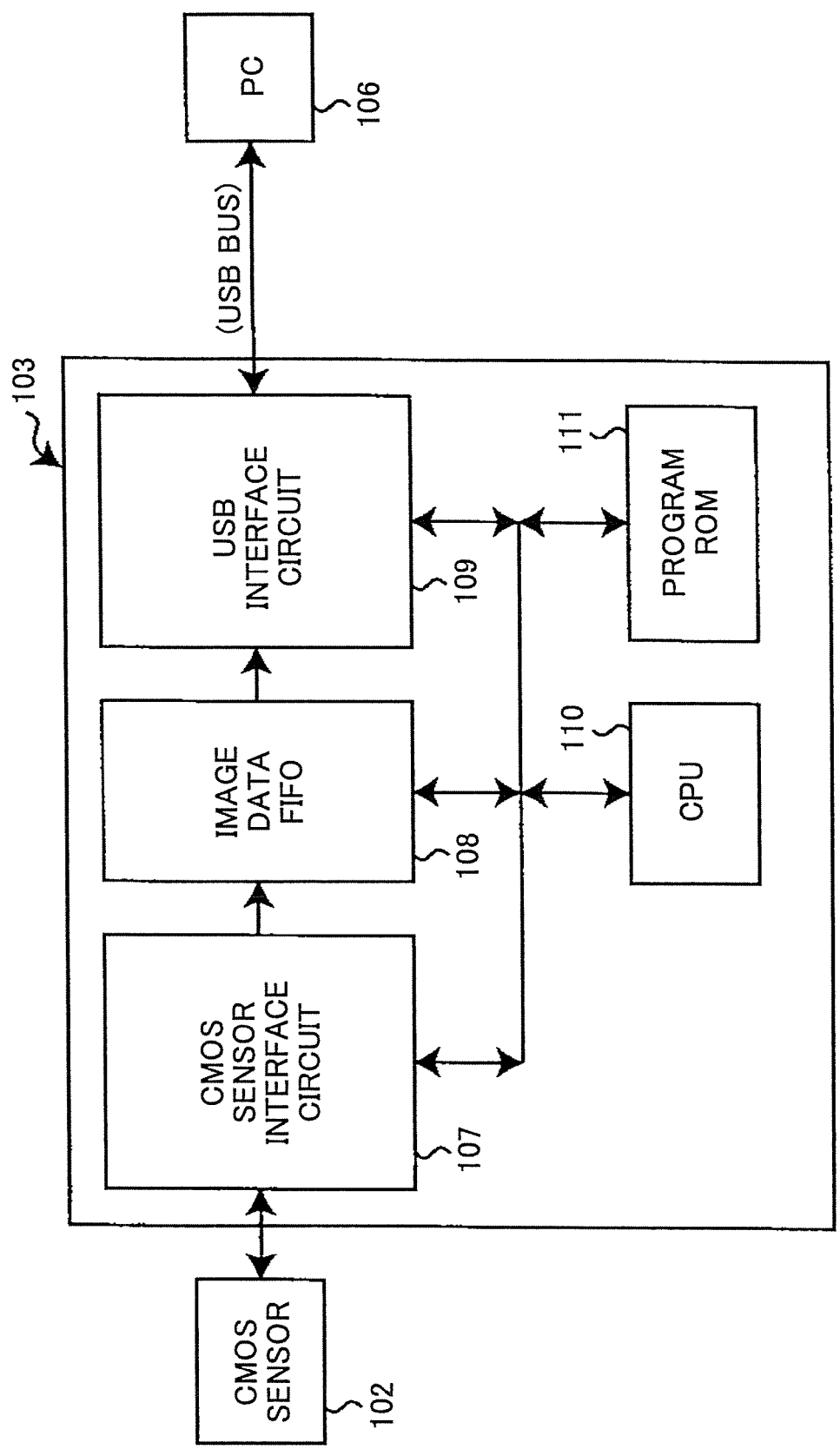
FIG. 14 is a block diagram illustrating an exemplary internal configuration of a USB controller 103 shown in FIG. 13.

In the example shown in FIG. 9, data are transferred by the CPU 11a between the external memory 3a and the program RAM 15. Alternatively, a DMA controller 19a may be used to speed up the data transfer as shown in FIG. 12. The DMA controller 19a manages the direction of data transfer between the external memory 3a and the program RAM 15 and addresses where data are read or written. The CPU 11a requests the DMA controller 19a to start direct memory access (DMA) and waits for a DMA completion report from the DMA controller 19a. Although the size of the semiconductor integrated circuit 1a becomes larger than that shown in FIG. 9, this configuration makes it possible to speed up data transfer. The external circuit 2a and the external memory 3a are switched in substantially the same manner as described above with reference to FIG. 9.

As described above, the semiconductor integrated circuit 1a of the second embodiment can be connected to the external circuit 2a or the external memory 3a using the same external signal line group 4. In a process of accessing the external circuit 2a, the CPU 11a deactivates the input-output function of the external memory 3a, activates the input-output function of the external circuit 2a, and then accesses the external circuit 2a. In a process of accessing the external memory 3a, the CPU 11a deactivates the input-output function of the external circuit 2a, activates the input-output function of the external memory 3a, and then accesses the external memory 3a and the program RAM 15. Thus, the semiconductor integrated circuit 1a of the second embodiment, which does not include a power supply circuit, has substantially the same advantageous effects as those of the semiconductor integrated circuit 1 of the first embodiment.

Embodiments of the present invention provide a semiconductor integrated circuit, a system device including the semiconductor integrated circuit, and a method of controlling the semiconductor integrated circuit.

Embodiments of the present invention make it possible to make a semiconductor integrated circuit capable of downloading a program from an external memory to an internal RAM without increasing the number of pins and the size of the semiconductor integrated circuit.

An embodiment of the present invention provides a semiconductor integrated circuit that can connect itself to an external circuit or an external memory via the same external signal line group by activating either the external circuit or the external memory to be accessed. This configuration eliminates the need to add terminals or pins to connect an external memory. In other words, this configuration makes it possible to adapt a semiconductor integrated circuit to accommodate an external memory without increasing the number of pins and the size of the semiconductor integrated circuit, and thereby makes it possible to reduce sizes and costs of cameras including semiconductor integrated circuits.

For example, a semiconductor integrated circuit according to an embodiment of the present invention may be incorporated in a camera system where an image sensor, such as a CMOS sensor or a CCD sensor, for converting a visual image into an electric signal is used as the external circuit mentioned above. Such a configuration makes it possible to easily rewrite programs in a camera system.

The present invention is not limited to the specifically disclosed embodiments, and variations and modifications may be made without departing from the scope of the present invention.

The present application is based on Japanese Priority Application No. 2006-242471, filed on Sep. 7, 2006, the entire contents of which are hereby incorporated herein by reference.

The invention claimed is:

1. A semiconductor integrated circuit that interfaces an external circuit and a host for controlling the external circuit and that obtains data used to interface the external circuit and the host from a rewritable external memory provided separately from the external circuit, comprising:
    external terminals to which an external signal line group is connected, the external signal line group including signal lines connecting the external circuit and the external memory in parallel;
    an external terminal interface circuit configured to interface the semiconductor integrated circuit and the external circuit or the external memory connected via the external signal line group;
    a control circuit configured to activate or deactivate the external circuit and the external memory and connected via a first signal line to the external terminal interface circuit; and
    an internal circuit configured to interface the semiconductor integrated circuit and the host and connected via a second signal line to the external terminal interface circuit,
    wherein the control circuit is configured to exclusively activate one of the external circuit and the external memory that is to be accessed via the external terminal interface circuit, and
    wherein the external terminal interface circuit is configured to connect one of the first signal line and the second signal line to the external signal line group under control of the control circuit.

2. The semiconductor integrated circuit as claimed in claim 1, wherein the control circuit is configured to activate or deactivate the external circuit and the external memory using a control signal.

3. The semiconductor integrated circuit as claimed in claim 1, further comprising:
    an internal volatile memory;
    wherein the control circuit is configured to read data from the external memory, to store the read data in the internal volatile memory, and to access the external circuit using the stored data.

4. The semiconductor integrated circuit as claimed in claim 3, wherein
    the control circuit includes an internal nonvolatile memory containing a preinstalled program and a CPU that operates according to the preinstalled program; and
    the CPU is configured to read a program used to access the external circuit from the external memory and to store the program in the internal volatile memory.

5. The semiconductor integrated circuit as claimed in claim 3, wherein
    the control circuit includes an internal nonvolatile memory containing a preinstalled program, a CPU that operates according to the preinstalled program, and a DMA controller that is controlled by the CPU; and
    the CPU is configured to cause the DMA controller to read a program used to access the external circuit from the external memory and to cause the DMA controller to store the read program in the internal volatile memory.

6. The semiconductor integrated circuit as claimed in claim 1, wherein the control circuit is configured to activate or deactivate the external circuit and the external memory by controlling power supply to the external circuit and the external memory.

7. A system device, comprising:
    an external circuit;
    a rewritable external memory provided separately from the external circuit; and
    a semiconductor integrated circuit configured to interface the external circuit and a host for controlling the external circuit and to obtain data used to interface the external circuit and the host from the external memory, wherein the semiconductor integrated circuit includes:
        external terminals to which an external signal line group is connected, the external signal line group including signal lines connecting the external circuit and the external memory in parallel,
        an external terminal interface circuit configured to interface the semiconductor integrated circuit and the external circuit or the external memory connected via the external signal line group,
        a control circuit configured to activate or deactivate the external circuit and the external memory and connected via a first signal line to the external terminal interface circuit, and an internal circuit configured to interface the semiconductor integrated circuit and the host and connected via a second signal line to the external terminal interface circuit, wherein the control circuit is configured to exclusively activate one of the external circuit and the external memory that is to be accessed via the external terminal interface circuit, and wherein the external terminal interface circuit is configured to connect one of the first signal line and the second signal line to the external signal line group under control of the control circuit.

8. The system device as claimed in claim 7, wherein the control circuit is configured to activate or deactivate the external circuit and the external memory using a control signal.

9. The system device as claimed in claim 7, wherein the semiconductor integrated circuit further includes an internal volatile memory; and the control circuit is configured to read data from the external memory, to store the read data in the internal volatile memory, and to access the external circuit using the stored data.

10. The system device as claimed in claim 9, wherein the control circuit includes an internal nonvolatile memory containing a preinstalled program and a CPU that operates according to the preinstalled program; and the CPU is configured to read a program used to access the external circuit from the external memory and to store the program in the internal volatile memory.

11. The system device as claimed in claim 9, wherein the control circuit includes an internal nonvolatile memory containing a preinstalled program, a CPU that operates according to the preinstalled program, and a DMA controller that is controlled by the CPU; and the CPU is configured to cause the DMA controller to read a program used to access the external circuit from the external memory and to cause the DMA controller to store the read program in the internal volatile memory.

12. The system device as claimed in claim 7, wherein the external memory is an EPROM.

13. The system device as claimed in claim 7, wherein the external circuit is configured to convert a visual image to an electric signal.

14. The system device as claimed in claim 13, wherein the external circuit comprises a CMOS sensor.

15. The system device as claimed in claim 13, wherein the external circuit comprises a CCD sensor.

16. The system device as claimed in claim 7, wherein the control circuit is configured to activate or deactivate the external circuit and the external memory by controlling power supply to the external circuit and the external memory.

17. A method of controlling a semiconductor integrated circuit that interfaces an external circuit and a host for controlling the external circuit and obtains data used to interface the external circuit and the host from a rewritable external memory provided separately from the external circuit, comprising the steps of:

exclusively activating one of the external circuit and the external memory that is to be accessed, the external circuit and the external memory being connected in parallel by the same external signal line group to the semiconductor integrated circuit, and connecting one of a first signal line and a second signal line to the external signal line group via an external terminal interface circuit of the semiconductor integrated circuit under control of a control circuit, wherein the first signal line connects the external terminal interface circuit with the control circuit, and wherein the second signal line connects the external terminal interface circuit with an internal circuit configured to interface the semiconductor integrated circuit with the host.

18. The method as claimed in claim 17, wherein the external circuit and the external memory are activated or deactivated using a control signal.

19. The method as claimed in claim 17, further comprising the steps of:

reading data used to access the external circuit from the external memory;

storing the read data in an internal volatile memory of the semiconductor integrated circuit; and accessing the external circuit using the stored data.

20. The method as claimed in claim 17, wherein the external circuit and the external memory are activated or deactivated by controlling power supply to the external circuit and the external memory.

* * * * *